United States Patent [19]
Burke et al.

[11] Patent Number: 5,291,041
[45] Date of Patent: Mar. 1, 1994

[54] ALGAAS/GAAS THYRISTOR

[75] Inventors: Terence Burke; Maurice Weiner, both of Ocean; Jian H. Zhao, North Brunswick, all of N.J.

[73] Assignee: The United States of America as represented by the Secretary of the Army, Washington, D.C.

[21] Appl. No.: 24,699

[22] Filed: Mar. 1, 1993

[51] Int. Cl.⁵ .............. H01L 27/14; H01L 31/00; H01L 29/74
[52] U.S. Cl. .................... 257/184; 257/109; 257/118; 257/132; 257/436; 257/439; 257/459; 257/466; 257/609
[58] Field of Search ............ 257/81, 85, 94, 97, 257/99, 102, 103, 109, 110, 113, 118, 132, 177, 184, 189, 436, 439, 459, 466, 609

[56] References Cited

U.S. PATENT DOCUMENTS

| | | | |
|---|---|---|---|
| 4,027,322 | 5/1977 | Heinecke | 357/38 |
| 4,829,357 | 5/1989 | Kasahara | 357/38 |
| 4,864,168 | 9/1989 | Kasahara et al. | 307/631 |
| 4,952,028 | 8/1990 | Tashira | 350/320 |
| 5,204,871 | 4/1993 | Larkins | 257/12 |

Primary Examiner—Ngan Ngo
Attorney, Agent, or Firm—Michael Zelenka; William H. Anderson

[57] ABSTRACT

The present invention comprises a semi-insulating layer of GaAs with p+ and n layers of aluminum gallium arsenide AlGaAs grown on one side of the semi-insulating GaAs and with p and n+ layers of AlGaAs grown on the other side of the semi-insulating GaAs. Ohmic contacts are grown on both sides of the thyristor as well as low temperature GaAs to provide for surface passivity.

3 Claims, 3 Drawing Sheets

ALGAAS/GAAS THYRISTOR

GOVERNMENT INTEREST

The invention described herein may be manufactured, used, sold, and/or licensed by, or on behalf of, the United States of America without the payment to us of any royalty thereon.

FIELD OF THE INVENTION

This invention relates to solid state switching devices and more particularly to an improved thyristor based on GaAs which is applicable to ultra-high power switching.

BACKGROUND OF THE INVENTION

Thyristor switches are widely used in areas such as power integrated circuits, power supplies, high-power lasers, and high power microwave systems. Presently, commercial manufacture of thyristor switches has been based strictly on silicon technology. However, there has been some research directed toward gallium arsenide GaAs thyristors. This research is described in articles such as, "Electrically Controllable Three-electrode High-voltage Subnanosecond Switches Made From a Multilayer GaAs-AlGaAs Heterostructure," by Alferov et al, *Sov. Tech. Phys. Lett.*, Vol. 12, No. 11, pgs. 529-530, 1986. The authors of this article report epitaxial grown AlGaAs/GaAs thyristors with hold off voltages up to 1000 V, and di/dt values of $5 \times 10^{10}$ A/s with peak current close to 10 A.

GaAs based thyristors for other applications have been described in U.S. Patents such as U.S. Pat. No. 4,027,322 issued May 31, 1977 to Heinecke and entitled, "Zero point switching thyristor having an isolated emitter region," and U.S. Pat. No. 4,829,357 issued May 9, 1989 to Kasahara and entitled, "PNPN thyristor."

SUMMARY OF THE INVENTION

Structurally, the present invention comprises a semi-insulating layer of GaAs with p+ and n layers of aluminum gallium arsenide AlGaAs grown on one side of the semi-insulating GaAs and with p and n+ layers of AlGaAs grown on the other side of the semi-insulating GaAs. Ohmic contacts are deposited on both sides of the thyristor as well as low temperature GaAs to provide for surface passivity.

Because AlGaAs is used as the optical window, the switch will be more sensitive to triggering and will provide for deeper light absorption. Further, the p+n and n+p layers will act as carrier emitters to inject high concentrations of carriers in the semi-insulating GaAs layer; thus, the optical energy required for triggering will be reduced substantially. Furthermore, the p+ —n and n+ —p layers act as light emitting diodes to smooth the turn on of the switching. Moreover and as those skilled in the art will appreciate, the use of a semi-insulating GaAs layer will drastically increase the switch voltage blocking capability.

In testing the present invention at bias voltages up to 2200 volts and laser turn on energies of only 0.3 µJ, peak currents were achieved in excess of 100 amps.

BRIEF DESCRIPTION OF THE DRAWINGS

The present invention will be better understood in light of the Detailed Description of the Invention and the drawings wherein.

DETAILED DESCRIPTION OF THE INVENTION

Figure 1:
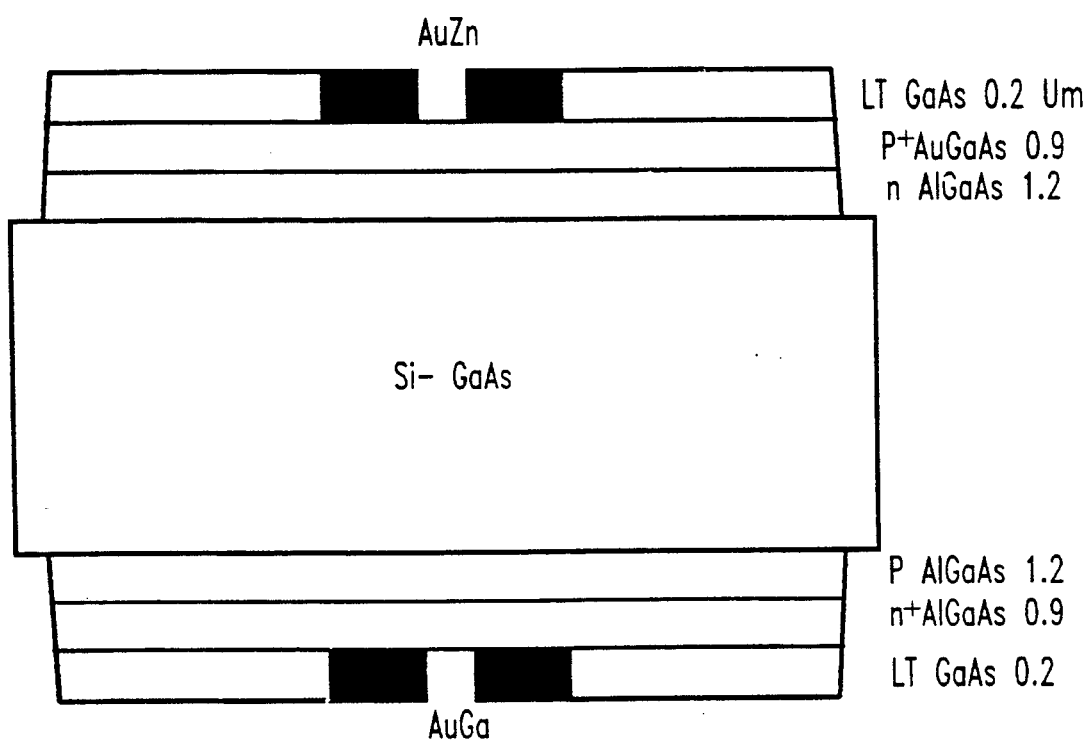
FIG. 1 is view of one embodiment of the invention in cross-section.

Now referring to FIG. 1, there is shown a cross-section of the present invention. This device is fabricated by using an undoped semi-insulating substrate of GaAs with a relatively high resistivity, for example $1 \times 10^6$ Ω·cm or higher. The substrate is polished on both sides to a width of approximately 650 µm. On one side of the substrate, a 1.2 µm N-$Al_{0.3}Ga_{0.7}As$ epilayer doped with silicon (Si) to $1 \times 10^{17}$ cm$^{-3}$ is grown by conventional molecular beam epitaxy techniques. Thereafter, a 0.9 µm P+ —$Al_{0.3}Ga_{0.7}As$ epilayer heavily doped with beryllium (Be) to $5 \times 10^{18}$ cm$^{-3}$ is grown on the N layer. For surface passivation, an undoped low temperature GaAs layer is grown on the P+ layer to a thickness of 0.2 µm at a temperature of 200° C. On the other side of the substrate a 1.2 µm P—$Al_{0.3}Ga_{0.7}As$ epilayer doped with Be to $3 \times 10^{17}$ cm$^{-3}$, a 0.9 µm N+ —$Al_{0.3}Ga_{0.7}As$ epilayer doped with Si to $1 \times 10^{18}$ cm$^{-3}$, and a 0.2 µm undoped low temperature GaAs film are grown respectively in order.

After molecular beam epitaxy growth, the wafer is annealed at 580° C. in the growth chamber for 20 minutes to stabilize the low temperature GaAs layers. After annealing, standard photolithography lift-off and etching processes are used to fabricate recessed circular ohmic contacts on both sides of the wafer. Typically, these contacts have diameters of approximately 0.5 cm and an optical aperture 0.1 cm in diameter and AuGe and AuZn are used as the ohmic contact materials on the N+ and P+ sides of the device, respectively. The ohmic contacts are separately prepared at a pressure below $1.6 \times 10^{-6}$ τ by thermal evaporations and both contacts are annealed at the same time at 420° C. for 1 min. Mesa etching is then used to define a junction area of approximately 0.79 cm$^2$ on both sides of the device surface.

In operation, a bias applied to wafer via the ohmic contacts. However, the semi-insulating GaAs layer will act as a voltage block so that no appreciable current will pass through the wafer even at voltages as high as 2200 volts. The switch is activated by a low energy laser pulse (0.3 µJ). Once the laser pulse is absorbed, the GaAs and the AlGaAs layers will become conductive and pass the current.

Figure 2:
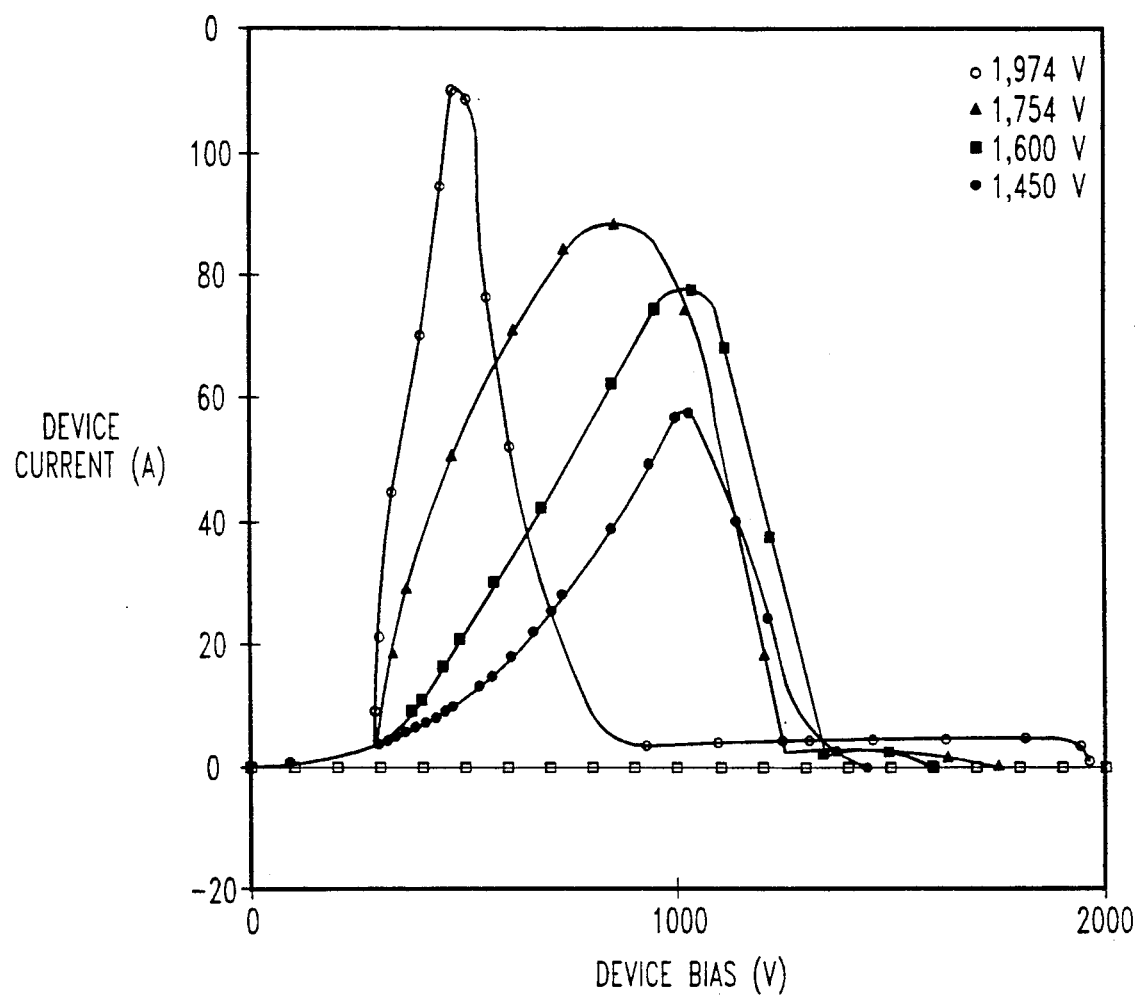
FIG. 2 is a graph of test results of the characteristics of the present invention.

Because AlGaAs is used as the optical window, the switch will be more sensitive to triggering and will provide for deeper light absorption. Further, the p+n and n+p layers will act as carrier emitters to inject high concentrations of carriers in the semi-insulating GaAs layer; thus, the optical energy required for triggering will be reduced substantially. Furthermore, the p+ —n and n+ —p layers act as light emitting diodes to smooth the turn on of the switching. Moreover and as those skilled in the art will appreciate, the use of a semi-insulating GaAs layer will drastically increase the switch voltage blocking capability. In tests, a forward bias of 2200 V produced a switched current of more than 180 A. The results of these tests for voltages under 2000 V are shown in FIG. 2. It should be pointed out that the I-V characteristics shown in FIG. 2 are dynamic characteristics and the time interval between the data points is 5 nanoseconds. As shown, at a forward bias of 1450 V, the switched peak current is 56 A, which increases to 115 A at 1974 volt bias. For this device, there is a very short (a few tens of nanoseconds) delay time in the rising up of the switched current with respect to the switching of the voltage.

Figure 3:
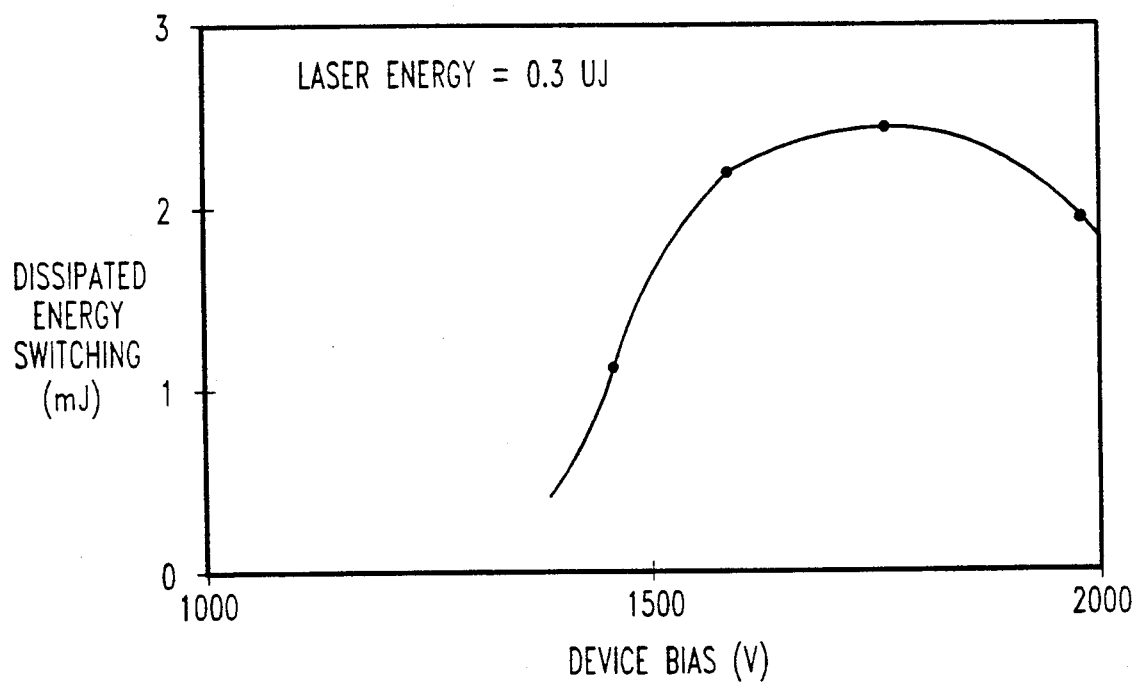
FIG. 3 is a graph of dissipated energy per switching as a function of the invention forward bias having a pulse width of 4 µs.

If one can control this delay time, then the power consumption may be greatly reduced. FIG. 3 is a graph of the dissipated energy as a function of the device bias. As shown, the datum point at the maximum bias, 1974 V, has a lower energy dissipation which is due to a switching delay of approximately 40 nanoseconds. For the device operated at 1974 V and with a switched current of 115 A, the dissipated energy was less than 2 mJ. Notice that a much larger percent of this 2 mJ energy will be dissipated by emitting photons through the direct band-to-band recombination in GaAs instead of in the form of heat or phonons when compared to that in silicon thyristors. Therefore, since silicon based thyristors for high power applications normally switch at a much slower speed, typically the microsecond range, it is expected that the fast switching of the present invention would dissipate much less energy and generate much less heat as indicated by the results found in FIG. 3.

Light-triggered thyristors are known to offer the best applications to high voltage direct current thyristor valves and VAR-control switches of simpler designs.

Having thus shown and described what is at present considered to be the preferred embodiment of the invention, it should be noted that the same has been made by way of illustration and not limitation. Accordingly, all modifications, alterations and changes coming within the spirit and scope of the invention are herein meant to be included. For example, the specific dimensions and compositions of the various epilayers may be engineered for several different performance specifications. An example of this would be to increase the width of the semi-insulating GaAs layer to provide for a higher hold-off voltage. Further, other III-V semiconductor materials could also be used as the photoconductive material. Similarly, the dopants described herein may also be different, for example carbon (C) may be substituted for Be for certain applications.

What is claimed is:

1. A photoconductive thyristor comprising:
   a semi-insulating substrate made of a III-V semiconducting material, the substrate having a top and bottom surface;
   a layer of n doped semiconductor material grown on the top surface of the substrate;
   a layer of p+ doped semiconductor material grown on the n doped layer;
   a first layer of semiconductor grown at a low temperature on the p+ doped layer for passivation;
   a layer of p doped semiconductor material grown on the bottom surface of the substrate;
   a layer of n+ doped semiconductor material grown on the p doped layer;
   a second layer of semiconductor grown at a low temperature on the n+ doped layer for passivation; and
   at least a first ohmic contact etched within the first layer of semiconductor grown at low temperature; and
   at least a second ohmic contact etched within the second layer of semiconductor grown at low temperature;
   wherein the n, p+, p and n+ layers all have a wider energy band gap than the substrate and wherein the low temperature semiconductor layers have approximately the same energy band gap as the substrate.

2. The thyristor of claim 1 wherein the substrate is made of gallium arsenide and the n, p+, p and n+ layers all made of aluminum gallium arsenide.

3. The thyristor of claim 1 wherein the n and n+ layers are doped with silicon and the p and p+ layers are doped with beryllium.

* * * * *